United States Patent
Eissa et al.

(10) Patent No.: US 6,605,536 B2
(45) Date of Patent: Aug. 12, 2003

(54) TREATMENT OF LOW-K DIELECTRIC FILMS TO ENABLE PATTERNING OF DEEP SUBMICRON FEATURES

(75) Inventors: Mona Eissa, Plano, TX (US); Guoqiang Xing, Plano, TX (US); Kenneth D. Brennan, Austin, TX (US); Hyesook Hong, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/143,314

(22) Filed: May 10, 2002

(65) Prior Publication Data

US 2002/0127876 A1 Sep. 12, 2002

Related U.S. Application Data

(63) Continuation of application No. 09/997,775, filed on Nov. 30, 2001, now abandoned.
(60) Provisional application No. 60/250,241, filed on Nov. 30, 2000.

(51) Int. Cl.$^7$ .................. H01L 21/44; H01L 21/302
(52) U.S. Cl. .................. 438/687; 438/597; 438/745
(58) Field of Search ................... 438/687, 633, 438/638, 739, 740, 745, 758, 761, 778, 584, 597

(56) References Cited

U.S. PATENT DOCUMENTS

| | | | | |
|---|---|---|---|---|
| 5,650,356 A | * | 7/1997 | Grivna et al. | 437/194 |
| 6,114,259 A | * | 9/2000 | Sukharev et al. | 438/789 |
| 6,187,216 B1 | * | 2/2001 | Dryer et al. | 216/95 |
| 6,200,901 B1 | * | 3/2001 | Hudson et al. | 438/697 |
| 6,242,344 B1 | * | 6/2001 | Koh et al. | 438/638 |
| 6,316,354 B1 | * | 11/2001 | Hu | 438/652 |
| 6,323,121 B1 | * | 11/2001 | Liu et al. | 438/633 |
| 6,342,448 B1 | * | 1/2002 | Lin et al. | 438/687 |
| 6,348,076 B1 | * | 2/2002 | Canaperi et al. | 51/309 |
| 6,410,437 B1 | * | 6/2002 | Flanner et al. | 438/689 |
| 6,417,098 B1 | * | 7/2002 | Wong et al. | 438/638 |

* cited by examiner

Primary Examiner—Kamand Cuneo
Assistant Examiner—Scott B. Geyer
(74) Attorney, Agent, or Firm—Jacqueline J. Garner; W. James Brady, III; Frederick J. Telecky, Jr.

(57) ABSTRACT

Treating a low-k dielectric layer (104) using a highly oxidizing wet solution (e.g., $H_2SO_4$) to improve patterning. Resist poisoning occurs due to an interaction between low-k films (104), such as OSG, and DUV resist (130,132). The wet treatment is performed to either pre-treat a low-k dielectric (104) before forming the pattern (130,132) or during a rework of the pattern (130,132) to reduce resist poisoning.

7 Claims, 1 Drawing Sheet

TREATMENT OF LOW-K DIELECTRIC FILMS TO ENABLE PATTERNING OF DEEP SUBMICRON FEATURES

This is continuation application of Ser. No. 09/997,775 filed Nov. 30, 2001 now abandoned which is a non-provisional application of provisional application number 60/250,241 filed Nov. 30, 2000.

FIELD OF THE INVENTION

The invention is generally related to the field of forming interconnect layers in a semiconductor device and more specifically to patterning low-k dielectric films.

BACKGROUND OF THE INVENTION

As the density of semiconductor devices increases and the size of circuit elements becomes smaller to achieve better performance, the resistance capacitance (RC) delay time in back-end-of-line (BEOL) increases and dominates the circuit performance. To reduce the RC delay time at BEOL, the demands on interconnect layers for connecting the semiconductor devices to each other also increase. Therefore, there is a desire to switch from the traditional aluminum metal interconnects to copper interconnects and from traditional silicon-dioxide-based dielectrics to low-k dielectrics, such as organo-silicate glass (OSG). Semicorductor fabrication processes for working with the copper interconnects and newer low-k dielectrics are still needed.

As compares to the traditional subtractive plasma dry etching of aluminum, suitable copper etches for a semiconductor fabrication environment are not readily available. To overcome the copper etch problem damascene processes have been developed. In a damascene process the IMD (intra-metal dielectric) is formed first. The IMD is then patterned and etched to form trenches for the interconnect lines. If connection vias have not already been formed, a dual damascene process may be used. In a via-first dual damascene process, an ILD (interlevel dielectric) is deposited first, followed by an IMD deposition. Am IMD etch-stop layer, such as SiN, can be optionally used in between IMD and ILD. A via is patterned and etched through the IMD and ILD for connection to lower interconnect levels. Then a trench is patterned and etched in the IMD. A barrier layer and a copper seed layer are then deposited over the structure. The barrier layer is typically tantalum nitride or some other binary transition metal nitride. The copper layer is electrochemically deposited (ECD) using the seed layer over the entire structure. The copper is then chemically-mechanically polished (CMP'd) to remove the copper from over the IMD, leaving copper interconnect lines and vias. A metal etch is thereby avoided.

When low-k dielectrics such as OSG are used for the IMD and ILD, a problem known as resist poisoning occurs. Resist poisoning occurs during a patterning step such as via pattern or trench pattern. It is a result of the interaction between a DUV (deep ultra-violet) resist and low-k films. Resist poisoning causes poor resist sidewall profiles, resist scumming, large CD variations, and requires a large resist exposure dose. Furthermore, the required resist exposure dose to achieve the target CD becomes too high and varies with film aging. A process to reduce or eliminate resist poisoning in low-k dielectrics is therefore desired.

SUMMARY OF THE INVENTION

The invention is a treatment for low-k films that improves patterning. The surface of the low-k film is oxidized using a highly oxidizing wet solution. Example wet solutions include $H_2SO_4$, $H_2SO_4:H_2O_2$, $HNO_3:H_2O_2$, $H_2O_2:H_2O$, and $O_3:H_2O$. The wet solution affects the surface of the film rendering patterning possible without disturbing the bulk properties of the low-k film. Wet treatment can be performed at various places in the semiconductor fabrication process with or without the presence of a resist.

An advantage of the invention is providing a treatment to reduce resist poisoning of low-k dielectric films.

This and other advantages will be apparent to those of ordinary skill in the art having reference to the specification in conjunction with the drawings.

DETAILED DESCRIPTION OF THE EMBODIMENTS

The invention will now be described in conjunction with dual damascene copper interconnect process. It will be apparent to those of ordinary skill in the art that the benefits of the invention may be applied generally to patterning of low-k (K<3.0) and ultra-low-k (K<2.5) films.

Figure 1A:
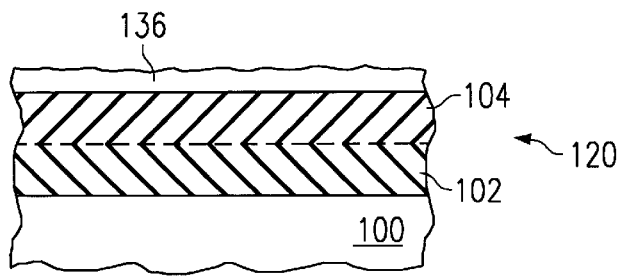
FIGS. 1A–1F are cross-sectional diagrams of a process for forming metal interconnects according to the embodiments of the invention.

In order to form the copper interconnects using a dual damascene process, the interlevel dielectric (ILD 102) and intra-metal dielectric (IMD 104) of FIG. 1A are patterned and etched to form trenches in IMD 104 and vias in ILD 102. When low-k or ultra low-k materials are used for the ILD and IMD, an interaction between the resist and the low-k materials causes resist poisoning. The cause of resist poisoning is believed to be the interaction of between the DUV resist and nitrogen-containing reagents from the low-k films. Possible sources of nitrogen include: the low-k film, the dielectric cap and optional IMD etch-stop layers (e.g., SiN) and/or chemistries used in the deposition of these films, $N_2$ in the clean (ash) process, $N_2$ in the etch chemistry, and the photoresist itself.

In order to reduce or eliminate the resist poisoning, a highly oxidizing wet treatment is performed on the surface of the low-k films. Oxidizing depletes carbon from the low-k film. However, only a thin layer at the surface is affected. Approximately 1800 Å of the low-k film is normally removed as part of a chemical-mechanical polish after copper deposition. Thus, the affected portion is removed. After the wet treatment, a thin and dense silicon oxide layer may be formed. This thin layer is an effective diffusion barrier for the N-based reagents in the OSG film and thus the resist poisoning is prevented.

The bulk properties of the film are unchanged. There is no significant change in the thickness, the refractive index, or the FTIR spectra of the low-k films subjected to a highly oxidizing wet solution according to the invention. Example chemistries for the highly oxidizing wet solution include $H_2SO_4$, $H_2SO_4:H_2O_2$, $HNO_3:H_2O_2$, $H_2O_2:H_2O$, and $O_3:H_2O$. In one embodiment, $H_2SO_4:H_2O_2$ is used at a ratio on the order of 4:1 at a temperature on the order of 90° C. and a duration of around 7–2 minutes depending on the process: removing resist (~7 min.) or just pretreatment (~2 min.). The chemicals and DIW (deionized water) rinse are sprayed on the surface of the wafers. The total process can be completed in 32 minutes including chemical exposure, DIW rinse and dry.

The above treatment using a highly oxidizing wet solution is beneficial at a variety of places in a metal interconnect process. The embodiments described below provide examples of where the wet treatment may be performed to reduce or eliminate resist poisoning. These embodiments may be combined to further reduce or eliminate resist poisoning.

Embodiments of the invention will now be discussed with reference to FIGS. 1A–1F. A semiconductor body 100 is processed through formation of the ILD 102/IMD 104. Semiconductor body 100 typically comprises a silicon substrate having transistors and other elements formed therein. IMD 104 is the dielectric for a copper interconnect level. The copper interconnect level may be the first or any subsequent metal interconnect level of the semiconductor device 120.

An ILD 102 is formed over semiconductor body 100. IMD 104 is formed over ILD 102. An etchstop layer (not shown) may optionally be placed between ILD 102 and IMD 104. ILD 102 and IMD 104 comprise low-k or ultra low-k dielectrics, such as organo-silicate glass (OSG). Alternatively, other low-k materials, such as inorganic low-k films (porous HSQ, xerogel, etc.) and organic low-k films may be used as ILD 102 and IMD 104. In the preferred embodiment, ILD 102 and IMD 104 comprise the same material. However, ILD 102 and IMD 104 may alternatively comprise different materials. A capping layer (not shown) may be formed over IMD 104 if desired. Typically, the capping layer comprises silicon nitride. Alternatively, a silicon oxide, silicon oxynitride (SiON), Si-rich nitride (SRN), or SiC capping layer or no capping layer may be used.

Figure 1B:
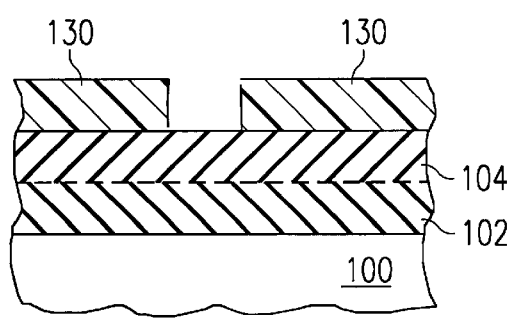

In a first embodiment of the invention the wet treatment (using a highly oxidizing wet solution 136 as described above) is performed prior to forming the via pattern 130. This oxidizes the top monolayers of the IMD 104. Then, the via pattern 130 is formed as shown in FIG. 1B. The wet pre-treatment reduces resist poisoning at the via pattern level.

It is sometimes necessary to rework a resist pattern. Rework is a process of removing the photoresist and/or BARC (Bottom Anti-Reflective Coating) material for re-patterning. Pattern re-work significantly worsens the resist poisoning problem if the plasma rework process uses $N_2$ or N-containing gases. Accordingly, in a second embodiment of the invention, the wet treatment (using a highly oxidizing wet solution) may be used to rework via pattern 130. The wet treatment both strips the resist pattern and oxidizes the top monolayers of IMD 104. An alternative to the second embodiment is to treat the surface of the dielectrics 104 with the oxidizing wet solution after a normal plasma re-work.

Figure 1C:
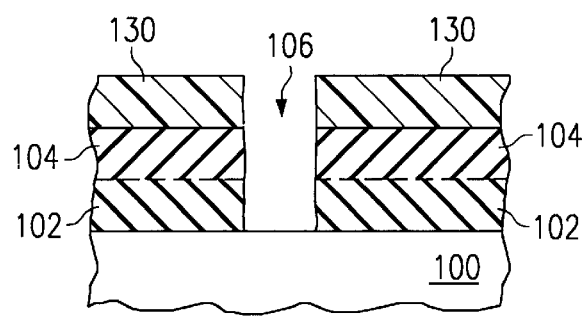

After any desired pattern re-work, the via 106 is then etched through IMD 104 and ILD 102, as shown in FIG. 1C. A post etch clean is then used to remove via pattern 106. If the bottom of the via remains protected by an etchstop layer (not shown), the wet oxidizing solution of the invention may be used for the post etch clean. Alternative chemistries for post etch cleans are known in the art.

In order to protect the bottom of vias 106 during the subsequent trench etch, vias 106 may be partially or completely filled. For example, a BARC material may be deposited over the structure and etched back such that BARC material remains only in the vias 106.

For the formation of the first copper conductor layer (trench-1 or Metal-1) single damascene is generally employed and there are no open via or contact holes present at the trench pattern. For the formation of the second and higher copper interconnects, dual damascene is used and open vias are present at trench pattern with the via-first approach.

In a third embodiment of the invention, the exposed surfaces of IMD 104 (and ILD 102 if appropriate) may be pre-treated with the highly oxidizing wet solution prior to forming the trench pattern. Pre-treatment prior to forming the trench pattern eliminates or reduces resist poisoning at the trench pattern level.

Figure 1D:
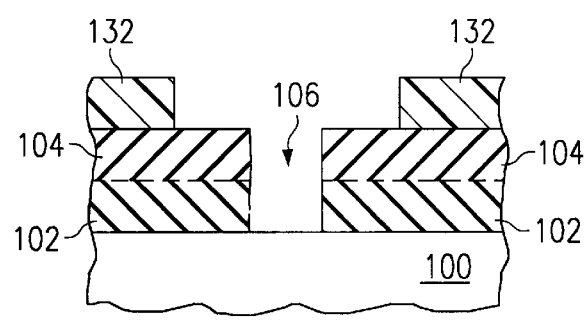

After a post etch clean and wet pre-treatment if desired, a trench pattern 132 may be formed over IMD 104, as shown in FIG. 1D. If rework of the trench pattern 132 is desired, the wet treatment may be used to rework the trench pattern 132, according to a fifth embodiment of the invention. The wet treatment functions to strip the trench pattern and reduce resist poisoning at the trench pattern level. An alternative to the fifth embodiment is to treat the dielectric surface with the oxidizing wet solution after a normal plasma rework.

Figure 1E:
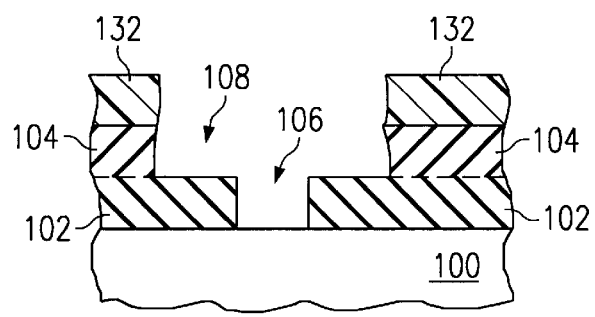

After any desired pattern rework, a trench 108 is etched in IMD 104, as shown in FIG. 1E. Copper interconnect structures will subsequently be formed in trench 108. Trench pattern 132 is then removed. A post trench-etch clean may then be performed.

Barrier layer 110 is deposited over IMD 104 including in trench 108 and via 106. Barrier layer 110 functions to prevent copper diffusion into the ILD and IMD layers. Suitable barrier materials such as Ta/TaN are known in the art. A seed layer is deposited over barrier layer 110.

Electrochemical deposition (ECD) may then be used to deposit copper layer 124. Various copper ECD processes are known in the art. In one example, a 3-step process is used. After placing the wafer in the plating solution, a current of approximately 0.75 Amps is passed through the seed layer for a time on the order of 15 seconds. The current is then increased to around 3 Amps for approximately 60 seconds. Final plating occurs at a current of about 7.5 Amps with the duration determined by the final desired thickness. A quick spin-rinse dry (SRD) is performed in the plating cell above the plating solution. The wafer is then transferred to the SRD cell and a post-ECD SRD is used to clean the plating residue.

Figure 1F:
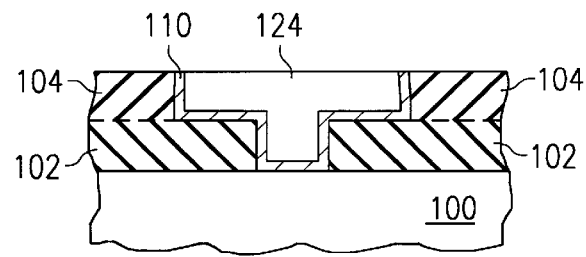

After copper ECD, the copper 124 and barrier 110 are chemically mechanically polished (CMP) to remove the material from above IMD 104. Any carbon depleted portion of IMD 104 at the surface would also be removed by the CMP step. The resulting structure is shown in FIG. 1F. Next level ILD and IMD may be deposited and processing may then continue to form additional metal interconnect levels and package the device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit having copper metal interconnects, comprising the steps of:

forming an interlevel dielectric (ILD) over a semiconductor body;

forming an intrametal dielectric (IMD) over the ILD;

oxidizing said IMD with a highly oxidizing wet solution;

forming a via resist pattern over said IMD;

etching a via in said IMD and ILD using said via resist pattern;

at least partially filling said via with a material;

forming a trench resist pattern over said IMD;

etching a trench in said IMD using said trench resist pattern;

removing said trench resist pattern and said material in said via; and forming a copper interconnect in said via and said trench.

2. The method of claim 1, wherein said highly oxidizing wet solution comprises $H_2SO_4$.

3. The method of claim 1, wherein said highly oxidizing wet solution is selected from the group consisting of $H_2SO_4$, $H_2SO_4$:$H_2O_2$, $HNO_3$:$H_2O_2$, $H_2O_2$:$H_2O$, and $O_3$:$H_2O$.

4. The method of claim 1, wherein said oxidizing step occurs prior to the step forming the via resist pattern.

5. The method of claim 4, further comprising the step of additionally treating the IMD using a highly oxidizing wet solution after said step of at least partially filling the via and prior to the step of etching the trench.

6. The method of claim 1, wherein said oxidizing step occurs after the step of forming the via resist pattern.

7. The method of claim 1, wherein said oxidizing step occurs after said step of at least partially filling the via and prior to the step of etching the trench.

* * * * *